United States Patent
Kordic et al.

(10) Patent No.: US 6,201,291 B1
(45) Date of Patent: Mar. 13, 2001

(54) SEMICONDUCTOR DEVICE AND METHOD OF MANUFACTURING SUCH A DEVICE

(75) Inventors: Srdjan Kordic; Cornelis A. H. A. Mutsaers, both of Eindhoven (NL); Mareike K. Klee, Huckelhoven-Randerath (DE); Wilhelm A. Groen, Limbricht (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/209,063

(22) Filed: Dec. 10, 1998

(30) Foreign Application Priority Data

Dec. 10, 1997 (EP) ................................. 970203872

(51) Int. Cl.$^7$ .................................................. H01L 29/00
(52) U.S. Cl. .................... 257/544; 257/506; 257/508; 257/649; 257/762; 257/767; 257/774
(58) Field of Search ................................. 257/544, 506, 257/508, 649, 762, 767, 774

(56) References Cited

U.S. PATENT DOCUMENTS

| | | | |
|---|---|---|---|
| 4,985,750 | * 1/1991 | Hoshino | 357/71 |
| 5,510,651 | * 4/1996 | Maniar et al. | 257/751 |
| 5,739,579 | * 4/1998 | Chiang et al. | 257/635 |
| 5,900,672 | * 5/1999 | Chan et al. | 257/751 |
| 6,037,257 | * 3/2000 | Chiang et al. | 438/687 |

FOREIGN PATENT DOCUMENTS

| | | |
|---|---|---|
| 0725440A2 | 8/1996 | (EP) . |
| 0751566A2 | 1/1997 | (EP) . |
| 0913863A2 | 5/1999 | (EP) . |
| 1009292 A4 | * 9/1996 | (JP) ........................ H01L/21/768 |
| 10092924A | 4/1998 | (JP) . |

* cited by examiner

Primary Examiner—Mahshid Saadat
Assistant Examiner—Matthew E. Warren
(74) Attorney, Agent, or Firm—Steven R. Biren

(57) ABSTRACT

A semiconductor device, for example an IC, having conductor tracks (3) of a metal (3) exhibiting a better conductance than aluminium, such as copper, silver, gold or an alloy thereof. The tracks are situated on an insulating layer (2) and are connected to a semiconductor region (1A) or to an aluminium conductor track by means of a metal plug (5), for example of tungsten, which is situated in an aperture (4) in the insulating layer (2). The bottom and walls of the aperture (4) are provided with an electroconductive material (6), such as titanium nitride, which forms a diffusion barrier for the metal (3). In accordance with the invention, the insulating layer (2) comprises a sub-layer (2A), which forms a diffusion barrier for the metal (3) and which extends, outside the aperture (4), throughout the surface of the semiconductor body (10). As a result, the conductor tracks (3) no longer have to be provided with a sheath serving as a diffusion barrier for the metal (3). The conductor tracks (3) may thus have a cross-section of very small dimensions, while the electric resistance will is still be sufficiently low. The same applies for any further conductor tracks (8), which may be present above the conductor tracks (3) and which are electrically insulated therefrom. Preferably, the electrically insulating sub-layer (2A) is situated approximately in the middle of the insulating layer (2). By virtue thereof, the contribution of the sub-layer (2A) to capacitances threatening the velocity of the IC is minimized. Suitable materials for the sub-layer (2A) are oxides, nitrides, fluorides and carbides, for example aluminium oxide, magnesium fluoride or silicon carbide. The insulating layers (2, 7, 11, 12) preferably comprise silicon dioxide.

6 Claims, 1 Drawing Sheet

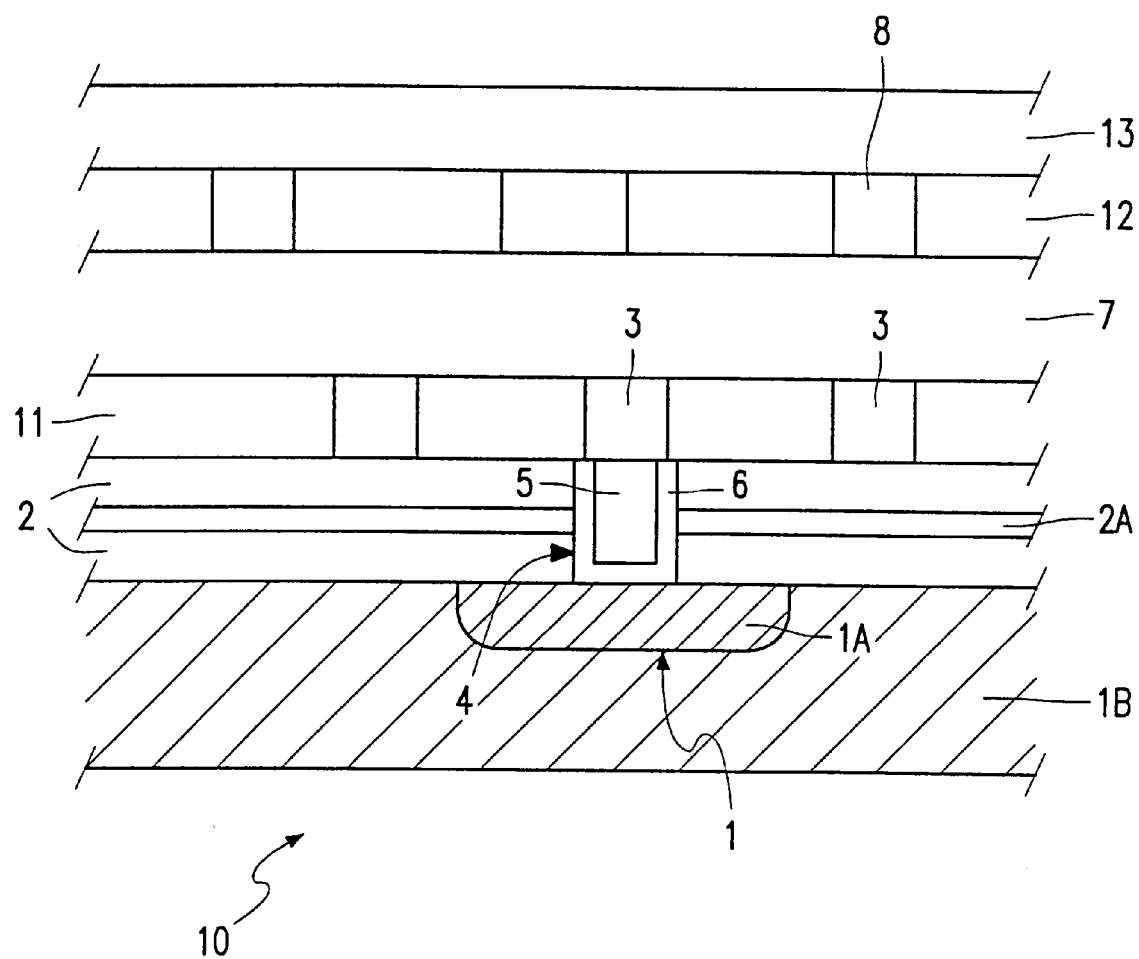

SEMICONDUCTOR DEVICE AND METHOD OF MANUFACTURING SUCH A DEVICE

BACKGROUND OF THE INVENTION

DESCRIPTION

The invention relates to a semiconductor device comprising a semiconductor body which includes at least an active element with a pn junction, the surface of the semiconductor body being provided with an electrically insulating layer on which a conductor track is situated, which is made of a metal having a lower resistivity than aluminium, which electrically insulating layer is provided with an aperture which contains a metal which electrically connects the conductor track to the active element or to an aluminium conductor track, the walls and the bottom of said aperture being provided with an electroconductive layer forming a diffusion barrier for the metal. The invention also relates to a simple method of manufacturing such a device.

Such a device is, for example, an IC (=Integrated Circuit). The active elements used in successive generations of such an IC are becoming smaller and smaller. In this connection, also the conductor tracks, which are responsible for the electric connection of the elements, are becoming ever smaller. If very small conductor tracks are made of aluminium, the resistance of the conductor tracks becomes too high. As a result, it is necessary to manufacture the conductor tracks from a metal having a better resistivity, such as copper, silver or gold.

Such a device is known from United States patent specification EP 0.751.566, published on Jan. 2, 1997. This patent document shows an IC comprising a copper conductor track on an electrically insulating layer, which conductor track is connected to an underlying aluminium conductor track via an aperture in the insulating layer which is also filled with copper. The side walls and the bottom of the aperture are provided with an electroconductive layer, which comprises tantalum nitride and forms a diffusion barrier for the copper. Also the copper conductor track is surrounded by such a layer.

A disadvantage of the known device is that the electroconductive layer, which serves as a diffusion barrier for copper, adversely affects the resistance of a conductor track or connection. The material of such a barrier has a higher resistivity than, for example, copper, and the barrier must be sufficiently thick if it is to serve as a diffusion barrier. In addition, undesirable interaction may occur between the material of the barrier and, for example, copper. Besides, the impact of these drawbacks becomes relatively large as the conductor tracks become smaller. Also the manufacture of such a device is relatively complex.

SUMMARY OF THE INVENTION

Therefore, it is an object of the invention to provide a device of the type mentioned in the opening paragraph, which does not have the above drawbacks and which comprises very small conductor tracks, for example of copper, and which can be readily manufactured.

To achieve this, a device of the type mentioned in the opening paragraph is characterized in accordance with the invention in that the electrically insulating layer comprises a sub-layer which forms a diffusion barrier for the metal and which extends, outside the aperture, throughout the surface of the semiconductor body.

The invention is based on the surprising realizations that if a diffusion barrier does not directly border on the conductor track, the provision of said diffusion barrier has no consequences for the dimensions and the manufacture of a conductor track, and that, in such a case, the barrier may also comprise a non-electroconductive material. By providing the insulating layer, throughout the surface of the semiconductor body, with a sub-layer which forms a barrier for the diffusion of, for example, copper, it is precluded that copper from a conductor track can penetrate the semiconductor body, and hence it is precluded that, for example, copper can adversely affect the service life of charge carriers in the active elements. As the sub-layer is contiguous to the electroconductive barrier layer present in the aperture, the entire semiconductor body is shielded from the metal. By virtue of the electrically insulating character of the sub-layer, this does not lead to electrical problems such as short-circuits. Consequently, in a device in accordance with the invention, the conductor tracks do not have to be provided with a sheath forming a barrier for the metal. If the conductor tracks are provided with a sheath, then this can be used for other functions such as, if necessary, ensuring a good adhesion between the metal and the adjoining insulating material and, if necessary, protecting the conductor track against impurities. Such functions may require a smaller thickness of the material or another material than the function of diffusion barrier for a metal like copper. Such functions also become easier to optimize because they are fulfilled independently of the metal-barrier function. The most important advantage, in this connection, is that the resistance of the conductor tracks of a metal like copper can be very low, even if the dimensions of the conductor tracks are very small. In addition, the manufacture of such a device is relatively simple.

In a very favorable embodiment of a device in accordance with the invention, the conductor track is covered with a further electrically insulating layer on which a further conductor track is situated which is made from the same metal as the first conductor track. Since also the further conductor track does not have to be surrounded by a sheath serving as a diffusion barrier for the metal, the advantage of the present invention is further increased.

In a preferred embodiment of a method in accordance with the invention, the sub-layer serving as a barrier is situated within the electrically insulating layer. Since an electrically insulating layer which can act as a diffusion barrier for a metal has a high dielectric constant, it is desirable for a good, i.e. rapid, operation of the device that such a capacitance-increasing layer is as far removed as possible from overlying and underlying conductor tracks or from underlying active elements. This is achieved by arranging the sublayer within the electrically insulating layer, preferably approximately in the middle of said layer.

Metals having a (much) lower resistivity than aluminium are, for example, copper, silver or gold, or an alloy of one or more of these metals. Very suitable electrically insulating materials which also form a good diffusion barrier for said metals are oxides, nitrides, fluorides or carbides. For example, the sub-layer may advantageously comprise aluminium oxide or magnesium oxide. Suitable nitrides are nitrides of aluminium or boron. Also silicon carbide or boron carbide can be used.

A method of manufacturing a semiconductor device comprising a semiconductor body which includes at least an active element with a pn junction, the surface of the semiconductor body being provided with an electrically insulating layer on which a conductor track is formed of a metal having a lower resistivity than aluminium, which electrically insulating layer is provided with an aperture, the side walls and the bottom of which are provided with an electroconductive layer which forms a diffusion barrier for the metal, and said aperture being provided with an electroconductive material which electrically connects the conductor track to another conductor track of aluminium or to the active element, is characterized in accordance with the invention in that the electrically insulating layer is provided with a sub-layer which forms a diffusion barrier for the metal and which extends, outside the aperture, throughout the surface of the semiconductor body. Such a method enables a semiconductor device in accordance with the invention to be obtained in a simple manner.

These and other aspects of the invention will be apparent from and elucidated with reference to the embodiments described hereinafter.

BRIEF DESCRIPTION OF THE DRAWINGS

In the drawing:

FIG. 1 is a schematic, cross-sectional view, at right angles to the thickness direction, of a semiconductor device in accordance with the invention.

The FIGURE is not drawn to scale and, particularly the dimensions in the thickness direction are exaggerated strongly for clarity. Like reference numerals refer to like regions, whenever possible, and regions of the same conductivity type are indicated by the same hatching whenever possible.

DESCRIPTION OF THE PREFERRED EMBODIMENTS

FIG. 1 is a schematic, cross-sectional view, at right angles to the thickness direction, of a semiconductor device, in this case an IC, in accordance with the invention. The device comprises a semiconductor body 10 having an active element 1 with a pn junction between two semiconductor regions 1A, 1B of an opposite conductivity type. The semiconductor body 10, which in this case comprises silicon, is provided with an electrically insulating layer 2, which in this case comprises silicon dioxide, in which an aperture 4 is formed at the location of the semiconductor region 1A. The insulating layer 2 is provided with conductor tracks 3 of a metal 3, in this example copper. Also the aperture 4 is provided with a metal 5, which in this example comprises tungsten. The bottom and the side walls of the aperture 4 are coated with a 5 nm thick electroconductive layer 6, which in this example comprises titanium nitride, which forms a diffusion barrier for the metal 3. In this manner, it is precluded that the metal 3 can penetrate the semiconductor region 1A via the aperture 4. A metal 3, for example copper, adversely affects the service life of charge carriers in a material like silicon, which is undesirable.

In accordance with the invention, the insulating layer 2 comprises a sublayer 2A, which forms a barrier for the metal 3 and which extends, outside the aperture 4, throughout the surface of the semiconductor body 10. By virtue of such an electrically insulating diffusion barrier, it is precluded that the metal 3 penetrates the semiconductor material of the semiconductor body 10 at a location outside the aperture 4. Together with the electroconductive barrier layer 6, an uninterrupted barrier for the metal 3 is formed. As a result, the conductor tracks 3 do not have to be provided with a sheath forming a diffusion barrier for the metal 3. This enables the conductor tracks 3 to be provided with a sufficiently low resistance even if their cross-section is very small. If desirable, the conductor tracks 3 may be provided with a very thin layer enhancing the adhesion to surrounding materials or counteracting the penetration of impurities from these materials into the conductor tracks 3.

A sub-layer 2A, which is suitable in accordance with the invention, comprises, for example, an oxide, a fluoride or a carbide. Apart from being electrically insulating, these materials also form excellent diffusion barriers for a metal 3, such as copper. In this example, the sub-layer 2A comprises aluminium oxide. In addition, such a material can be readily provided by means of techniques customary in the semiconductor technology, such as sputtering. A suitable thickness of the sub-layer 2A is, in this case, for example 5 to 200 nm. In this example, the thickness of the sub-layer 2A is 100 nm. Positioning the sub-layer 2A approximately in the middle of the electrically insulating layer 2 has the important additional advantage that capacitive effects which adversely affect the velocity of the device are as low as possible, since, an electrically insulating sub-layer 2A forming a good diffusion barrier for copper will generally have a relatively large dielectric constant relative to, for example, silicon dioxide. Said capacitive effects are minimal as a result of the fact that this sub-layer 2 is arranged as remote as possible from, on the one hand, the active elements 1 and, on the other hand, the conductor tracks 3.

The conductor tracks 3 are situated in another electrically insulating layer 11, which in this example is made of silicon dioxide. This insulating layer is provided with a further electrically insulating layer 7 of silicon dioxide which supports further conductor tracks 8 which also comprise copper. The observations made above with respect to conductor tracks 3 also apply to these further conductor tracks 8. The advantage of the invention is greater as the number of stacked or non-stacked conductor tracks increases. The further conductor tracks 8 are situated in yet another electrically insulating layer 12 which, in this case, also comprises silicon dioxide. In this example, the stack of conductor tracks 3, 8 is provided with an electrically insulating top layer 13 of silicon nitride.

The parts of the electrically insulating layer 2 situated below and above the sub-layer 2A have a thickness, in this example, ranging between 100 and 300 nm. In this example, the thickness is 200 nm. The dimensions of the aperture 4 are 0.5 $\mu$m by 0.2 $\mu$m. The conductor tracks 3, 8 are substantially square in cross-section, and the cross-sectional dimensions are 0.4×0.5 $\mu m^2$. This is also the thickness of the other electrically insulating layers 11, 12. The further electrically insulating layer 7 has a thickness of 0.5 $\mu$m, and the thickness of the top layer 13 is 1 $\mu$m.

The device in accordance with this example is manufactured in the following manner using a method in accordance with the invention. To produce a semiconductor body 10 (see FIG. 1) use is made of a substrate of silicon in which or on which, inter alia, semiconductor regions 1A, 1B of opposite conductivity type are formed as parts of an active element 1. The surface of the semiconductor body 10 is provided with an electrically insulating layer 2 which successively comprises a first layer 2 of silicon dioxide, a sub-layer 2A of aluminium oxide and a second layer 2 of silicon dioxide. An aperture 4 is formed in said layer at the location of the semiconductor region 1A by means of photolithography and etching. The bottom and side walls of said aperture are provided with a thin conductive layer 6 of titanium nitride, and the aperture 4 is filled with a metal 5, in this example tungsten. In this case, this is carried out as follows: the thin layer 6 is provided throughout the surface of the semiconductor body 10 by means of CVD (=Chemical Vapor Deposition). Subsequently, the entire surface of the semiconductor body 10 is provided, also by means of CVD, with a thicker layer 5 of tungsten, thereby entirely filling the aperture 4. Finally, the resultant structure is made flat again, in this case by means of CMP (=Chemical Mechanical Polishing). In this process, the portions of the thin layer 6 and the thicker layer 5 situated outside the aperture 4 are removed again.

Subsequently, the insulating layer 2 is provided with a further insulating layer 11 in which recesses are formed at the location of the conductor tracks 3 to be formed. In this example, the conductor tracks are formed by applying copper throughout the surface of the semiconductor body by means of PVD (=Physical Vapor Deposition), whereafter the structure is made flat again by means of CMP, thereby removing the copper from the insulating layer 2. A conductor track 3 is electrically connected, for example, to the semiconductor region 1A by means of the metal 5. Subsequently, a further insulating layer 7 is applied, and said layer is provided, in a similar manner as the insulating layer 2, with further conductor tracks 8 in yet another insulating layer 12. The structure is completed by an insulating top layer 13. The material and the thickness of the different layers are selected as indicated hereinabove. The same applies to the dimensions of the aperture 4 and the dimensions of the conductor tracks 3 and the further conductor tracks 8. The silicon dioxide-containing layers are provided, in this example, by means of PECVD (=Plasma Enhanced Chemical Vapor Deposition), the aluminium oxide layer is provided by means of CVD, and the silicon nitride layer is provided by means of PECVD.

The invention is not limited to the above example, and, within the scope of the invention, many modifications and variations are possible to those skilled in the art. For example, thicknesses, (semiconductor) materials or compositions other than those mentioned in the examples can be employed. The metal used to fill the aperture in the insulating layer may also be, for example, aluminium instead of tungsten. If desirable, the same or a similar metal can be used as for the (further) conductor tracks, for example copper. It is also possible to simultaneously replace all conductivity types used by the opposite conductivity types. The pn junction of the active element may comprise a pn junction of a MOST (=Metal Oxide Semiconductor Transistor). A conductor track may also be connected to the gate electrode of such a transistor, which gate electrode comprises, for example polycrystalline silicon.

It is noted, in particular, that the electrically insulating sub-layer may also comprise a semiconductor material provided that the electric resistance thereof is sufficiently high. This depends, inter alia, on the permissible leakage currents in a concrete IC. An example of a suitable semiconductor material which may have a very high impedance is silicon carbide. The electrically insulating layers outside the sub-layer forming a diffusion barrier may advantageously comprise a synthetic resin such as teflon, parilene or polyimide. Such materials have a very low dielectric constant.

Various process steps, which are not relevant to the invention, may also be carried out differently; for example, an oxide layer obtained by means of deposition from the gas phase may alternatively be obtained by means of oxidation or by deposition from a plasma. Instead of using the PVD technique to provide the metal layers, it is alternatively possible to provide said layers by means of the CVD technique or, possibly, by means of an electrochemical/electrodeposition technique. Also other variations in the manufacturing process are possible. For example, the insulating layer in which the further conductor tracks are formed and the underlying insulating layer can be separated from each other by means of an etch-stop layer. It is also possible to provide both layers in a single deposition step. In this case, the recesses in which the further conductor tracks are formed extend, for example, halfway into said single insulating layer.

Finally, it is noted again that, if necessary, the conductor tracks may be provided with a thin sheath to enhance the adhesion to the surrounding electrically insulating layers and to prevent contamination of the conductor tracks with impurities from said electrically insulating layers. For example, the adhesion between a metal, such as copper, and a synthetic resin can be improved by means of a very thin chromium layer. To protect the conductor tracks against impurities, use can be made of a very thin titanium or tantalum layer or a very thin oxidic layer.

What is claimed is:

1. A semiconductor device comprising a semiconductor body (10) which includes at least an active element (1) with a pn junction, the surface of the semiconductor body being provided with an electrically insulating layer (2) on which a conductor track (3) is situated, which is made of a metal having a lower resistivity than aluminium, which electrically insulating layer is provided with an aperture (4) which contains a metal (5) which electrically connects the conductor track (3) to the active element (1) or to an aluminium conductor track, the walls and the bottom of said aperture (4) being provided with an electroconductive layer (6) forming a diffusion barrier for the metal (3), characterized in that the electrically insulating layer (2) includes therein an intermediate sub-layer (2A) which forms a diffusion barrier for the metal of conductor track (3) and which extends, outside the aperture (4), over the entire surface of the semiconductor body (10).

2. A semiconductor device as claimed in claim 1, characterized in that the conductor track (3) is covered with a further electrically insulating layer (7) on which a further conductor track (8) is situated which is made from the same metal as the first conductor track (3).

3. A semiconductor device as claimed in claim 1, characterized in that the sub-layer (2A) of the electrically insulating layer (2) is included within the electrically insulating layer (2) approximately in the middle of said layer.

4. A semiconductor device as claimed in claim 1, characterized in that the metal (3) comprises copper, silver or gold, or a copper, silver or gold-containing alloy.

5. A semiconductor device as claimed in claim 1, characterized in that the sub-layer (2A) of the electrically insulating layer (2) comprises an oxide, nitride, fluoride or carbide.

6. A semiconductor device as claimed in claim 1, characterized in that the electrically insulating layer (2) and the further electrically insulating layer (7) comprise silicon dioxide, silicon nitride or a silicon oxynitride.

* * * * *